United States Patent [19]

Crane et al.

[11] Patent Number: 4,888,449
[45] Date of Patent: Dec. 19, 1989

[54] SEMICONDUCTOR PACKAGE

[75] Inventors: Jacob Crane, Woodbridge, Conn.;
Barry C. Johnson, Tucson, Ariz.;
Deepak Mahulikar, Meriden, Conn.;
Sheldon H. Butt, Godfrey, Ill.

[73] Assignee: Olin Corporation, New Haven, Conn.

[21] Appl. No.: 140,859

[22] Filed: Jan. 4, 1988

[51] Int. Cl.$^4$ ................ H01L 23/10; H01L 23/36
[52] U.S. Cl. .................... 174/52.4; 29/827
[58] Field of Search .......... 174/16 HS, 52 FP; 357/74, 81; 428/418, 626

[56] References Cited

U.S. PATENT DOCUMENTS

| | | | |
|---|---|---|---|
| 3,676,292 | 7/1972 | Pryor et al. | 428/4.33 |
| 3,697,666 | 10/1972 | Wakley et al. | 174/52 FP |
| 3,726,987 | 4/1973 | Pryor et al. | 174/50.61 |
| 3,728,177 | 4/1973 | Caule | 156/3 |
| 3,740,920 | 6/1973 | Lane | 437/218 |
| 3,914,858 | 10/1975 | Sonoda et al. | 437/217 |
| 3,993,123 | 11/1976 | Chu et al. | 165/80 |
| 4,105,861 | 8/1978 | Hascoe | 174/52 FP |
| 4,149,910 | 4/1979 | Popplewell | 148/6.35 |
| 4,410,927 | 10/1983 | Butt | 361/386 |
| 4,461,924 | 7/1984 | Butt | 174/52.4 |
| 4,468,293 | 8/1984 | Polan et al. | 204/27 |
| 4,480,262 | 10/1984 | Butt | 357/74 |
| 4,481,525 | 11/1984 | Calabro et al. | 357/81 |
| 4,491,622 | 1/1985 | Butt | 428/632 |
| 4,500,605 | 2/1985 | Fister et al. | 428/469 |
| 4,515,671 | 5/1985 | Polan et al. | 204/228 |
| 4,521,469 | 6/1985 | Butt et al. | 428/35 |
| 4,524,238 | 6/1985 | Butt | 174/52 FP |
| 4,525,422 | 6/1985 | Butt et al. | 428/418 |
| 4,532,222 | 7/1985 | Butt | 501/32 |
| 4,542,259 | 9/1985 | Butt | 174/52 FP |
| 4,551,210 | 11/1985 | Parthasarathi | 204/28 |
| 4,552,206 | 11/1985 | Johnson et al. | 165/80.3 |
| 4,570,337 | 2/1986 | Butt | 29/840 |
| 4,577,056 | 3/1986 | Butt | 174/52 FP |
| 4,582,556 | 4/1986 | Butt et al. | 156/325 |
| 4,594,770 | 6/1986 | Butt | 437/219 |
| 4,607,276 | 8/1986 | Butt | 357/79 |
| 4,649,083 | 3/1987 | Fister et al. | 428/469 |
| 4,651,192 | 3/1987 | Matsushita et al. | 357/81 X |
| 4,656,499 | 4/1987 | Butt | 357/74 |
| 4,682,414 | 7/1987 | Butt | 29/840 |
| 4,696,851 | 9/1987 | Pryor | 428/210 |
| 4,704,626 | 11/1987 | Mahulikar et al. | 357/74.1 |
| 4,707,724 | 11/1987 | Suzuki et al. | 357/71 |
| 4,712,161 | 12/1987 | Pryor et al. | 361/411 |
| 4,725,333 | 2/1988 | Leedecke et al. | 156/630 |
| 4,796,083 | 1/1989 | Cherukuri et al. | 357/74 |

Primary Examiner—A. T. Grimley
Assistant Examiner—David A. Tone
Attorney, Agent, or Firm—Gregory S. Rosenblatt; Paul Weinstein

[57] ABSTRACT

A semiconductor package for an electrical component which has a metal or metal alloy leadframe with first and second surface, which leadframe is adapted to have an electrical component connected thereto. The leadframe is bonded by means of a polymer to a copper or copper alloy base member. The leadframe is also bonded by means of a polymer to a copper or copper alloy cap member. The cap and base members have coated to their inside surfaces a metal or metal alloy. The coating improves the polymer bond between the leadframe and the base and cap members. The surface area of the base member is increased to transfer more heat from the silicon chip in the semiconductor package and to reduce the thermal stresses between the silicon chip and the base member.

47 Claims, 2 Drawing Sheets

SEMICONDUCTOR PACKAGE

While this invention is subject to a wide variety of applications, it relates to semiconductor packages in general and, more particularly, to an improved structure for a non-hermetic sealed semiconductor package, which improves the quality and reliability thereof. Certain aspects of the present invention are applicable to hermetically sealed semiconductors.

In one type of a non-hermetic semiconductor package, an electronic device, supported on a leadframe, is molded by or encapsulated in plastic. In another type of a non-hermetic semiconductor package, two pieces of alumina ceramic are sealed to a leadframe with a suitable solder glass to form a hermetic ceramic dual-in-line package (CERDIP).

Another variation of this non-hermetic semiconductor package is a quad package. The quad package is shown in an article which appeared in the May, 1987, Volume 1, No. 2 of *Manufacturing Electronic Packaging and Processing Engineering Journal*, FIGS. 1, 2 and 3.

In yet another variation of the non-hermetic type of semiconductor package described above, metal has been inserted in the package to replace the plastic. In a semiconductor package which is made of metal, the device is sealed usually by using adhesives as well as by brazing or welding. Adhesives have been used in the art to bond semiconductor packages as taught in U.S. Pat. No. 3,740,920 to Lane and in U.S. Pat. No. 3,914,858 to Sonoda et al.

A typical plastic sealed semiconductor package is taught in U.S. Pat. No. 4,105,861 to Hascoe. The semiconductor package includes a base member which may be made of metal, ceramic, glass or plastic. The cap member also may be made of metal, ceramic, glass or plastic. It also includes a leadframe. Usually the package includes layers of adhesive such as epoxy. The epoxy is usually sandwiched between the leadframe and the cap member and the leadframe and the base member.

The use of copper or copper alloys as the material for the base member and the cap member has been well known in the prior art. The use of metal or metal alloys or copper or copper alloys in semiconductor packages is shown in U.S. Pat. No. 4,524,238 to Butt.

The problem typically associated with the use of copper or copper alloys in adhesively bonded semiconductor packages is the relatively short life of the adhesive to copper bond in various reliability tests. The standard oxides on copper result in relatively lower life in reliability tests.

The failure in polymer-to-metal bond, i.e. between the adhesive and the leadframe or the metal cap or lid provides an avenue through which moisture and other contaminants can reach the electrical device and cause corrosion failure. This problem and others associated therewith are fully explained in U.S. Pat. No. 4,594,770 to Butt and the accompanying references in that patent.

One of the primary objectives of this invention is to improve the bond between the copper or copper alloy leadframe, base and cap members to the polymer or adhesive that is used.

Another aspect of this invention is the desire to transfer heat outside of the semiconductor package. During the operation of a semiconductor device, heat is generated on the face of the semiconductor chip or die. In conventional packages, the majority of the generated heat is first dissipated through the thickness of the silicon chip, then through the brazing material or to the adhesive which mounts the chip to the substrate and finally the heat is dissipated through the package. The package itself is often formed from low thermal conductivity plastic or ceramic which further impedes the heat dissipation.

Thus, in order to accelerate the rate of heat transfer out of the chip, this invention provides a method of increasing the surface area and a method of decreasing the thermal resistance of the base member so that heat dissipation can be improved.

Accordingly, the present invention provides a semiconductor package for an electrical component which has a metal or metal alloy leadframe connected to an electrical component. The base and cap members are of a copper or copper base alloy material. The base and cap member have a coating formed on each of the surfaces of a metal, metal alloy, or intermetallic compound selected from the group consisting of nickel, tin, cobalt, chromium, molybdenum, tungsten, titanium, zirconium, hafnium, niobium, tantalum, germanium, aluminum and alloys of the foregoing metals. The base and cap members have bonded to each coated surface a polymer component. The leadframe is embedded in the polymer component between the cap member and the base member to form the package.

In another aspect of this invention, a semiconductor package has a metal or metal alloy leadframe and a metal or metal alloy cap and base member. The base member has on the outside surface expanded surface area means such as grooves to provide additional surface area for heat transfer. This increased surface area provides improved heat transfer. The base member may also have a cavity for receiving the die attach wherein the thickness of the cavity in the base member is substantially less than the thickness outside of the cavity. The thin base cavity reduces the thermal resistance between the semiconductor die attach and the outer surface of the base member. The thinner base member also reduces the thermal stresses on the silicon chip in the package.

Other objects, as well as means and advantages, of the invention will be apparent or will appear hereafter.

Accordingly, it is a principal object of the present invention to provide a coated surface at least on the copper or copper alloy cap and base components of the package. The additional coating added to the copper or copper alloy should provide a surface which provides a more reliable bond to the polymers used as adhesives in the semiconductor package. One material that is found to be particularly valuable for bonding is electroplated nickel, although other materials applied by electroplating or by other methods such as electroless plating, sputtering, hot dipping, chemical vapor deposition and physical vapor deposition may be used as well.

Also, it is another object of the present invention to provide a means for increasing the heat transfer outside of the package by increasing the outside surface area of the package components through which heat is to flow out of the semiconductor package and by reducing the thermal resistance of the semiconductor chip support.

These and other advantages will become more apparent from the following description and drawings.

Figure 1:
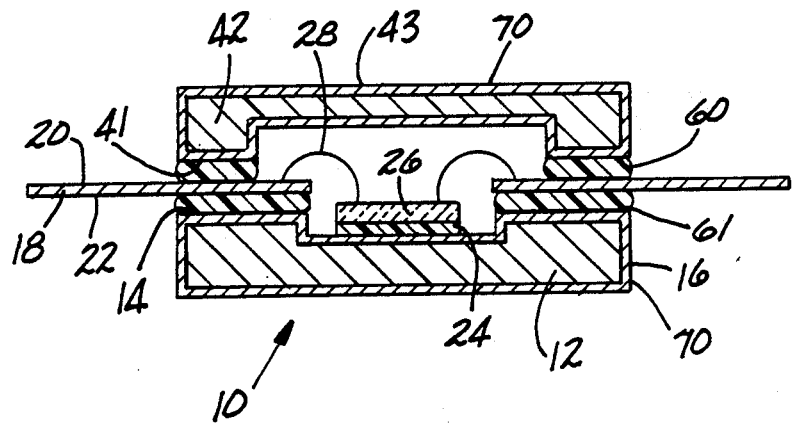
FIG. 1 is a cross-sectional view of a non-hermetically sealed semiconductor package according to one embodiment of this invention.

Referring now to FIG. 1 which shows a first embodiment of a non-hermetically sealed semiconductor package 10 having a base member 12. A leadframe 18 has inner and outer surfaces 20 and 22, respectively. A cap member 42 is provided having inner and outer surfaces 41 and 43, respectively. An adhesive layer 60 bonds the leadframe 18 to the inner surface 41 of the cap member. The adhesive layer 61 bonds the leadframe 18 to the inner surface 14 of the base member 12. Fixed by die attach 24 on the surface of the base member 12 is a semiconductor chip 26 which is attached to the leadframe 18 by conductors 28.

It can be understood that, during the process by which leadframe 18 is attached to base member 12 by the adhesive layer 61, some of the adhesive layer 61 may flow out and cover the side of the base member 12. This flowing of excessive adhesive can cause the polymer or adhesive bond to be weakened, if it does not adhere to the side of the base member.

Figure 2:
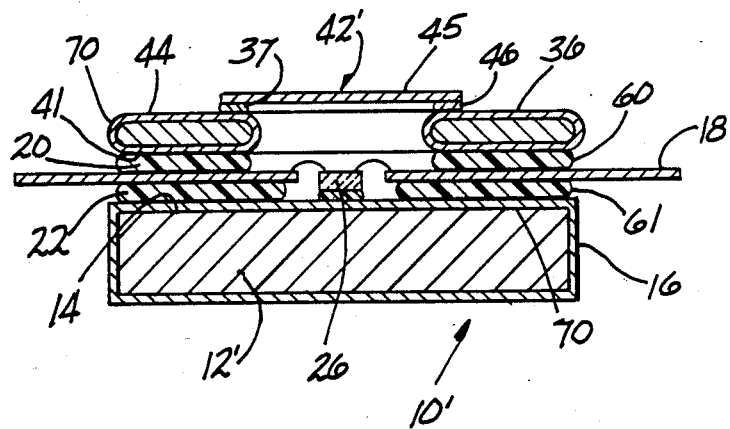
FIG. 2 is a cross-sectional view of a non-hermetically sealed semiconductor package constructed according to another of the embodiments of the present invention.

Referring to FIGS. 1 and 2 and in the remaining figures, the same or similar elements have been given like or primed reference numbers. On at least the inside surface 14 of the base member 12 or 12' there has been provided a coating 70 of a metal or metal alloy. Preferably, the entire surface of the base component 12 is coated so that the adhesive bond is not weakened if excess adhesive 61 flows out over the side 16. The coating 70 is also provided on the cap member 42 on at least the inside surface 41 and preferably the entire surface of the cap member. It will be understood that the thicknesses of coatings 70 as shown on the cap 42 or 42' and base 12 or 12' members are shown greatly out of proportion to the actual thicknesses of the metal or metal alloy coated. Typically, the coating on the copper or copper base alloy components will be from about 0.01 to about 50 microns thick.

In FIG. 1 the cap member 42 is a unitary element and the package is typically used in DIP and Quad Pac type applications. The embodiment of FIG. 2 is a "window frame" type package wherein the cap 42' is an assembly comprising window frame 44 and cover 45 sealed thereto. If the cover 45 is sealed to the window frame 44 by a metal or alloy 46 such as in soldering, then it need not be coated with a coating 70. If the cover 45 is polymer sealed, then it should have a coating 70.

It will be understood in practicing the present invention that the coating covers the complete inside surfaces of the surfaces 41 and 14 of the base 12 and cap 42 members and preferably the entire surfaces of the package components 12 and 12' and 42 and 42'. However, the coating is only required at the areas which will be sealed when the semiconductor package has been completely assembled. Preferably, the copper alloy leadframe is similarly coated with a metal or metal alloy of this invention.

The coating 70 used may be applied by any convenient means, including electroplating, electrolessplating, vapor deposition, sputtering, and lamination. Etching may be used to roughen the surface. The surface of the coating 70 can also be modified to improve the bond for the adhesive by several means. For example, the coatings could receive a post-plate treatment such as oxidation, passivation or annealing. In addition, the coated metals could also have their surface made porous by adjusting the electrochemical parameters of the plating process by means known in the art. Another means for treating the surface is to have the surface when it is coated with nickel be additionally coated with aluminum. It is then heat treated to generate Ni-Al intermetallics. Then, the intermetallics are etched to provide increased surface area. Other means for post treating the surfaces could include applying to each of the surface areas which have been treated with metals or alloys silanes or titanates. Another treatment for the coated metals or alloys is to have each of the surfaces chemically attacked by acids to provide a rougher surface. Rough surfaces have been discovered to be better surfaces for the adhesion of polymers.

Examples of coating systems which may be employed to provide a suitable coating follow:

Nickel

Nickel plating has been found to be useful. In addition to being provided as a plating, a nickel coating can also be made by other means such as chemical vapor deposition and sputtering. Furthermore, the "nickel" coating may be pure nickel, or it may be an alloy of nickel. When provided as an alloy, it should offer desirable oxidation characteristics. Some of the alloys which may be used include nickel alloys with tin, chromium, and/or cobalt, copper, phosphorous or boron, etc.

Tin

Tin may be used as an alternative to nickel as described above.

Cobalt

Cobalt and appropriate cobalt alloys may be used as an alternative to nickel as described above.

Chromium

Chromium and alloys of chromium may be used as a coating. When used as a plated coating, it is desirable that an undercoat, such as a nickel undercoat, be applied between it and the bulk copper alloy. This is necessary because chromium is characteristically brittle and is, therefore, applied in a very thin layer which may be porous.

Molybdenum and Tungsten

Molybdenum and tungsten may be used as an alternate to chromium. The most desirable means of providing coatings of these metals and their alloys are by sputtering or chemical vapor deposition.

Titanium, Zirconium, and Hafnium

These metals and their alloys may be used and have desirable oxidation characteristics. Interdiffusion with copper and copper alloy material is quite slow and these metals may be used as thin, sputtered or chemical vapor deposited coatings. Because of their slow interdiffusion with the bulk copper or copper alloy, coatings with these metals are also particularly adaptable to use as diffusion barriers with other final coatings.

Aluminum

Aluminum may be used as a coating. A suitable barrier, typically nickel or cobalt, between the aluminum and the bulk copper alloy is needed to avoid excessive interdiffusion.

Niobium and Tantalum

These metals and their alloys may also be used as coatings.

In addition to coating the copper or copper base alloy components with one or another of the various metals or alloy systems noted above, the desired coating may be formed in situ. For example, by vapor deposition of a thin layer of aluminum on the bulk copper alloy, followed by interdiffusion, so as to generate a surface layer of copper-aluminum alloy. The thickness of the aluminum coating and the diffusion process to be used in the case of this example must be established such that excessive aluminum does not remain on or near the surface of the coated material to the extent that the brittle copper-aluminum intermetallic will be present after interdiffusion.

In addition to the coatings above, a conversion type coating which includes black and brown oxides of copper have proven to be effective for bonding the adhesive to a metal or metal alloy. A brief discussion of this is provided below.

Black Oxide

Black oxide uses hot, alkaline, chlorite solution to oxidize the copper to copper oxide. Phosphate is added as a catalyst. The nature of this oxide, that is its crystallinity and the amount of cuprous and cupric oxides it contains, varies with the temperature of the bath and the concentration of chlorite and hydroxide. Because of this, current commercial oxide baths fall into two categories: a traditional black oxide, which consists of relatively long, needle-like crystals, and a brown or red oxide, which consists of smaller, more compact crystals (A. H. Reed, "I.P.C. World Conference Proceedings," New York, NY, May, 1984, paper III-01).

Table I below illustrates examples of brown and black oxide and a typical bath associated therewith.

TABLE I

|  | Black Oxide | Brown Oxide |
| --- | --- | --- |
| Sodium Chlorite | 80 g/L | 15-60 g/L |
| Sodium Hydroxide | 40 g/L | 5-10 g/L |
| Sodium Phosphate | 5-10 g/L | 5-10 g/L |
| Operating Temperature | 190-205° F. | 140-205° F. |

All of the preceding systems described and discussed are to be considered as examples, it being understood that other coatings fulfilling the criteria established may be devised as well by one skillful in the art to provide a relatively thin material having desired oxidation characteristics at the surface of the base material.

In coating the copper or copper alloy cap and base members with nickel, the present invention uses the following process to obtain a 0.5 mil rough, dull, grey, nickel plating which has a thickness that is less than and about 15 micron and preferably less than about 10 micron. To begin the plating process, the nickel plating bath is prepared. A typical bath is the sulfamate bath with the following approximate composition:

| Distilled water | 1,000 ml |  |
| --- | --- | --- |
| Nickel sulfate | 330 gms |  |
| Nickel chloride | 45 gms |  |
| Boric acid | 38 gms |  |
| Sodium laural sulfate | 100 ppms, | as a wetting agent |

The bath is kept at a constant temperature of 60° C. The pH of the solution is maintained between 3 and 4.

The metal components are prepared by thoroughly degreasing and cleaning with acetone/methyl alcohol. The components may be dilute acid dipped for further surface cleaning.

The metal components are then plated on both sides using a double nickel anode. The bath is constantly agitated and the current density is kept around 0.01 amps/CM$^2$. The resulting nickel plate is about 0.5 mils thick and has a rough, dull, grey surface texture.

Technology for plating various metals is disclosed in *Electroplating Technology Recent Developments*; J. I. Duffy Editor, published by Noyes Data Corporation, Park Ridge, New Jersey in 1981, which is incorporated herein by reference.

The non-hermetic semiconductor package 10 or 10' used in the present invention comprises a copper or copper base alloy cap 42 or 42' and base 12 with a copper alloy leadframe 18 bonded together by an adhesive sealant 20. The adhesive preferably is an epoxy, filled or unfilled, though filled is preferred. The life of a copper to epoxy bond usually is determined in a conventional accelerated steam pot test. The test uses penetration of a fluorescent die as one of the failure criterion for the adhesive to metal bond. The failure of the circuitry or the interconnection on the chip are detected electrically. This test is fully explained in the following references: K. Ogawa, J. Suzuki, K. Sano, "Automatically Controlled 2-Vessel Pressure-Cooker Test Equipment", IEEE Trans. on Reliability, Vol. R-32 (1983); K. Ogawa, J. Suzuki, K. Sano, "Reliability Evaluation of Plastic Encapsulated ICs Using a New Pressure Cooker Test", Proc. Int'l Soc. for Testing and Failure Analysis, pp. 75-80, (1981); W. Schroen, J. Spencer, J. Brian et al., "Reliability Tests and Stress in Plastic Integrated Circuits", Reliability Physics, 19th Annual Proc., 1981, IEEE, Orlando; and J. F. Gunn et al., "An Appraisal of High Temp. Humidity Stress Tests for Assessing Plastic Encapsulated Semiconductor Components", Reliability Physics, 21st An. Proc., 1983, IEEE, Phoenix.

The problem is that the usual oxides on copper are not strong and temperature dependent properties weaken the adhesive bond at the surface. In addition, the cross section of stamped leadframes are rectangular with sharp corners. During prior thermal treatments, stresses induced at these corners can initiate failure in the adhesive to metal bond.

Presented below are several techniques to counteract the temperature dependence problem, improve the mechanical interlocking of the polymer, and reduce the stress concentrations on the leadframe. These techniques are expected to result in significant improvement of the copper-to-polymer bond life.

In accordance with this invention, thin layers of metals are coated over at least the inner surfaces of the cap 42 or 42' and base member 12 (prior to plastic encapsulation) by deposition techniques as described and preferably by electrolytic or electroless plating. Metals such as nickel are believed to have less activity and/or selectivity than copper alloys, leading to improved metal to polymer bond life.

Further improvement can be realized by post-plate treatments such as oxidation or passivation of the deposited metal or by adding conversion coatings as discussed earlier. Many technical aspects related to passivation and oxidation are explained in Passivity of Metals, by The Electrochemical Society, Edited by Frankenthal and Kruger. This book is incorporated herein by reference as teaching passivation and oxidation techniques for metals. Enhancement of the metal-polymer bond can also be attained by improving the mechanical interlocking between the plated layer and the polymer.

The mechanical interlocking enhancement can be achieved by several techniques. In one such technique the plating can be made porous by adjusting the electrochemical parameters of the electroplating bath. Another technique involves inducing phase transformations in the coating accompanied by localized volume contraction or by etching out certain elements in the plated layer selectively. These techniques are taught in U.S. Pat. No. 4,468,293 to Polan et al. and U.S. Pat. No. 4,515,671 to Polan et al.

Electroless nickel plating can be made porous by heat treatments. This porous plating provides increased surface area and sites for mechanical interlocking. The electroless nickel plating contains significant amounts of phosphorous. The phosphorous contents can be as high as 10 wt.%. During subsequent heat treatments phosphide formation occurs which is associated with significant volume contraction. The volume contraction results in porosity. The volume fraction of the porosity is proportional to the amount of phosphides that form during the heat treatment. Typically, 10 to 20 volume percent porosity can be obtained.

Another technique for mechanical interlocking enhancement would involve diffusion-induced intermetallic formation with the base copper and then etching away the remaining metal plating. This will provide a rough surface for better adhesion. It is well known in the art that Sn plated copper alloy form Cu-Sn intermetallics during subsequent heat treatments. The intermetallics are hard and brittle. The amount of intermetallics depends on the temperature and time of the treatment. The intermetallics will alter the catalytic action at the surfaces. They will also make the surface rougher. Among various intermetallics, this invention covers the use of $Cu_3Sn$ and $Cu_6Sn_5$. Additionally, the copper alloy can be plated with nickel (Ni) then coated with aluminum (Al), heat treated to generate Ni-Al intermetallics and have its surface roughened to provide increased surface area and better mechanical interlocking with the adhesives.

In another method, plating parameters are manipulated to cause "dendritic" surface formation over the copper. For example, in some applications, rough surfaces are obtained by current and voltage manipulations. Similar parameters can be determined for nickel or tin plating. This is taught in U.S. Pat. No. 4,551,210 to Parthasarathi.

Silane or Titanate treatments on inorganic surfaces are also known to improve the polymer adhesion bond. However, such treatments do not work with copper surfaces. Here again, a plating on copper with the metal or metal alloy provides a new surface which then can be treated with Silanes or Titanates. It should be noted that the platings not only provide a new surface, but also smoothen out the sharp corners of the leadframe cross section thus changing the stress concentration.

A final technique to improve the metal to polymer bond is to have the surface chemically attacked to increase surface roughness, provide better mechanical interlocking and smooth out the stress concentration regions. Acids and their combinations can be used to accomplish this objective. The coating can be applied to the base and cap members using any of the techniques.

In the preferred embodiment, the coating is applied by electroplating it to the surface of the base and cap members. The range of the coating thickness which would be acceptable is from 0.01 to 50 microns. The preferred range of coating thickness is from 0.1 to 15 microns. The coating thickness should be 50 microns or less to be totally effective. A coating thickness above 50 microns began to weaken the bond to the cap and base members. Another phenomenon which occurs as the coating thickness increases is the thermal resistance increases and the heat dissipation from the chip, base and cap members decrease. The change in heat dissipation results from increased thickness of the member with a lower thermal conductivity than the copper or copper alloy used for the cap, base or leadframe. If the coating used is a nickel or nickel alloy, it will have a lower conductivity. Therefore, the thickness of the coating should be minimized to obtain optimum heat transfer.

Several tests have been performed to determine the effects bonding would have on the plating of the copper alloy. In the tests, a comparison was made with different types of nickel plates and with the components unplated. The tests were performed at various time increments and the percent of adhesion of the epoxy to the plated specimen was measured. The test uses penetration of a fluorescent die as the failure criterion. The multiple pin package which was used in the test was placed in a pressure cooker for various increments of time in a steam environment of 2 atm and 121° C. The table below is a summation of the results that were obtained. Table II shows that the epoxy bond to metal was significantly improved by having the copper alloy plated with nickel. The table also shows that a nickel plating which is dull and rough provides a better bond between the epoxy and the copper compared to nickel plating which is bright and smooth.

TABLE II
MULTIPLE PIN PACKAGES
% PASSAGE IN THE PRESSURE COOKER/DIE PENETRATION TEST

| CONDITION | EPOXY CURE + DIE ATTACH | | |
|---|---|---|---|
| | (EC) 200 HR | 300 HR | (DA) 400 HR |
| UNPLATED COMPONENTS | 100% | 67% | NT |
| Ni PLATED DULL, ROUGH | 100% | 100% | 100% |

| CONDITION | EC + DA + THERMOSONIC BOND + CAPSEAL + WAVE SOLDER | | |
|---|---|---|---|
| | 100 HR | 200 HR | 300 HR |
| Ni PLATED DULL, ROUGH | 100% | 100% | 67% |
| Ni PLATED BRIGHT, SMOOTH | 67% | 50% | 0% |

NT = No Test

Figure 4:
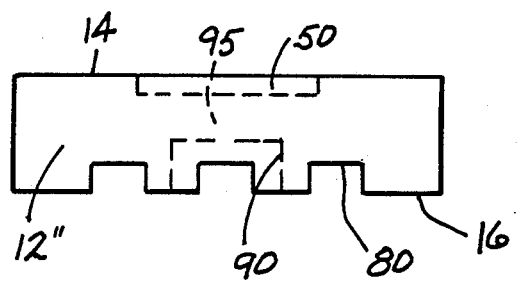
FIG. 4 is a side view of a base member constructed according to yet another embodiment of the present invention.
Figure 5:
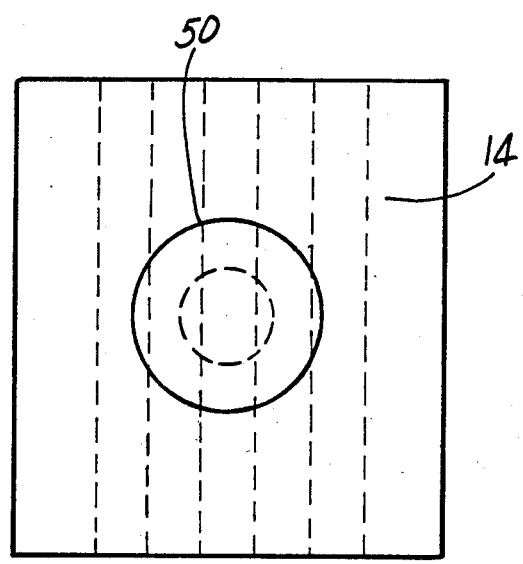
FIG. 5 is a top view of FIG. 4.

In the most preferred embodiment of the present invention, the leadframe of the semiconductor package can be nickel plated. The leadframe 18, as shown in FIG. 4, is shown to have sharp points at two of its edges. These points can create stress concentrations and cause the bond to weaken. By coating the entire surface of the leadframe including the sharp edges, as described above, the stresses at the points of the leadframe are reduced. The coating should cover the whole exposed surface of the leadframe. The adhesive which would normally bond to the leadframe would be bonded to the coated surface. The adhesive will have a larger surface area to bond to and will provide a better bond between the polymer and the leadframe, the cap member and the base member. Thus, the use of a coating on the leadframe should reduce or eliminate the problems normally associated with the geometry of the leadframe.

Figure 6:
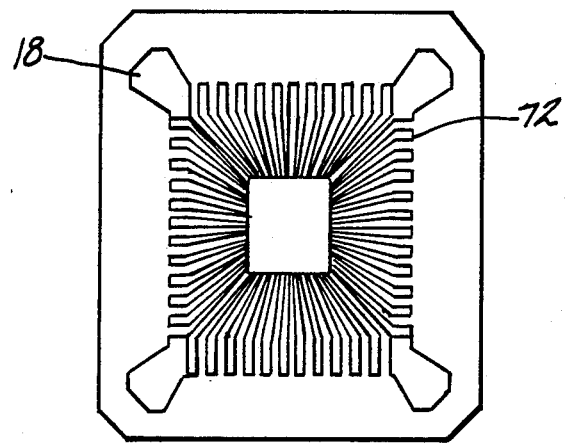
FIG. 6 is a top view of a quad leadframe.

The present invention is related to a package which has a stamped leadframe. Note FIG. 6 illustrates a stamped quad leadframe. A stamped leadframe typically has an irregular cross section. The irregularities are mostly associated with the sharp corners of the leadframe. The sharp corners 72 of the leadframe result in a very poor polymer to metal bond. The present invention provides that a metal or metal alloy be plated to the leadframe and the plating would encompass the sharp corners. This would result in the leadframe having a better bonding surface.

On the other hand, the leadframe could be of an alternative design which is widely used. This alternative design is an etched leadframe. This leadframe is provided with rounded corners, or it has a more symmetrical geometry. Thus, the leadframe of this design may not require the plating described by the present invention to obtain good polymer to metal bond.

Figure 3:
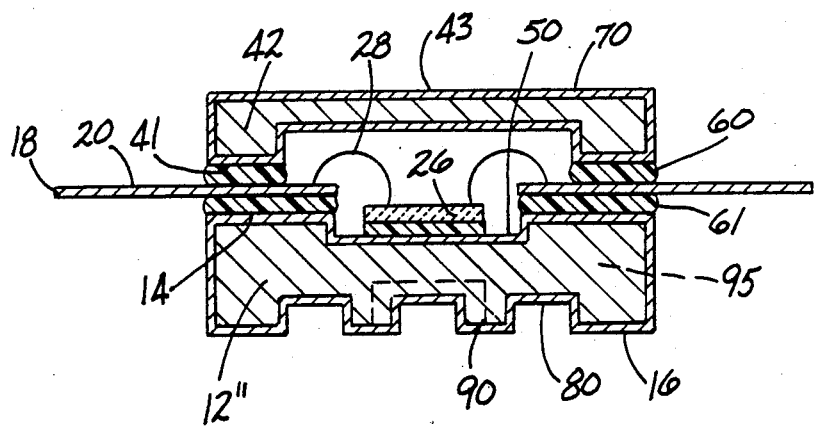
FIG. 3 is a cross-sectional view of a non-hermetically sealed semiconductor package constructed according to yet another embodiment of the present invention.

In FIG. 3, there is shown a base member 12" of a semiconductor package in accordance with another embodiment of the invention. The base member 12" has on its outside surface a series of grooves 80 which run across the base member 12. This provides for increased surface area for the base members' surface area as compared to a planar surface. The addition of grooves to the base members provides additional surface area for heat to be transferred from the base member. The increase in surface area improves the thermal heat dissipation of the semiconductor package 10 or 10' if the base member 12" were substituted for the members 12 or 12'. The semiconductor chip 26 is usually mounted in the cavity 50 on the die attach 24 as in FIG. 1. The chip 26 itself generates heat which seeks a path of least resistance in order to leave the semiconductor package 10 or 10'. The heat from the chip flows a small distance before dissipating through the walls of the package 10 or 10'. With the addition of the extra surface area provided by the grooves 80, the heat dissipation is maximized through the base member 12". The increased surface area will provide an increase in the convective heat transfer from the chip 26. The heat dissipation from the package will be maximized when the thermal resistance of the base member 12" in the surrounding is minimized. The cavity 50 is made to a depth to allow proper wire bonding and to reduce the thickness at the cavity portion of the base member 12". The conduction of the heat out of the cavity is directly related to the thickness of the base member 12" in the cavity 50. The thickness of the base member is thus minimized in order to allow the heat to be tranferred outside of the cavity more readily. A simple formula showing the relationship of the thickness of metal underneath the cavity to the heat dissipated outside of the base is provided by the following equation:

$\theta_{ja} = \theta_{jc} + \theta_{ca}$.

$\theta_{ja}$ is the total thermal resistance.

$\theta_{jc}$ is the thermal resistance of the chip to the outside surface of the base member.

$\theta_{ca}$ is the thermal resistance from the package to the surroundings. An important portion of $\theta_{jc}$ is proportional to $$\frac{T_B}{K_B A_B}$$

$T_B$=base member thickness, $K_B$=base member conductivity and $A_B$=base member surface area. Thus, according to the above equation, the thickness of the base member has a direct relationship to the thermal resistance $\theta_{jc}$. As the thickness decreases, the thermal resistance decreases proportionally.

Thus, with the use of a high conductivity material such as copper or copper alloy for the base member and increasing the surface area the maximum amount of heat transfer from the silicon chip can be realized.

The heat generated in operation of a semiconductor device is primarily on the face of the semiconductor chip or die. In conventional packages, most of the heat is removed by heat transfer through the thickness of silicon chip, then through the surrounding material which mounts the chip 21 to the base member 12 or 12' or 12". The thermal conductivity of the silicon is less than that of the copper used in a metal semiconductor package. Even if thermal conductivity of the silicon is not an absolutely limiting factor, the temperature drop required for heat transfer due to the silicon chip is still of importance since this temperature difference has the effect of raising the temperature upon the surface of the chip. Thus, increasing of the surface area of the package 10 or 10' is usually done by external means. U.S. Pat. No. 4,410,927 to Butt teaches that the addition of an external member to the semiconductor package would improve heat transfer outside of the unit.

The base member 12" in FIG. 3 has grooves 80 in the outside surface. The addition of grooves 80 increases the surface area for the base member 12". The increase in the surface area allows more heat to be transferred from the package. Thus, the increased surface area increases the heat dissipation rate from the chip 26.

Also provided in FIG. 3 is a backside cavity 90 which can be made in the outside surface 16 of the base member 12. This cavity can be provided by removing part of the backside surface area underneath the cavity 50 which the chip 26 would be placed in. This would reduce the thickness even further for the base member 12". The backside cavity will have three important benefits. First, it is expected to reduce the thermal stresses on the Si chip after the die attach process. The average stress on the Si chip is derived as (see "Engineering Design" by J. Faupel, John Wiley & Sons, 1964):

$$\sigma_{si} = \frac{\Delta\alpha \, \Delta T \, E_{si}}{1 + \frac{W_{si} t_{si} E_{si}}{W_{cu} t_{cu} E_{cu}}}$$

where subscript si stands for silicon and cu stands for copper base. The symbol $\alpha$ (alpha) represents the linear thermal expansion coefficient, T is the temperature gradient and E is the modulus of elasticity. Using the equation above, results are tabulated in Table III below. The table illustrates stresses on the Si chip for various copper thicknesses of the substrate for the chip.

TABLE III

| Thickness of Copper (inches) | Stress on Silicon (ksi) |
|---|---|
| 0.07 | 64.25 |
| 0.04 | 48.2 |

TABLE III-continued

| Thickness of Copper (inches) | Stress on Silicon (ksi) |
| --- | --- |
| 0.01 | 25.3 |

The calculation assumes a 0.45" wide copper substrate bonded rigidly to a 0.35" wide, 0.02" thick Si chip. The Table clearly illustrates the benefit of having a thinner copper section underneath the chip. The stresses are reduced significantly.

The second advantage of the backside cavity is the reduction of thermal resistance in proportion to the reduction in thickness.

Finally, the third advantage of the backside cavity is the certain amount of weight reduction of the base member which is important in Aerospace applications where weight is a primary consideration.

This cavity 90 can be formed by any number of means. One means could be by machining (counterboring) the base member to form a cavity thickness which is substantially less than the thickness of any other portions of the base member. Preferably, the thinned portion 95 is from about 5 mil to about 30 mil thick.

The base member, shown in FIG. 3, can be used on either a hermetic or non-hermetic package. If a non-hermetical package seal is used, the adhesive material used would most likely be an epoxy. In that event, in the present invention the metal or metal alloy used to form the base 12", leadframe 18 and cap 42 may be of any material such as copper or copper alloy. Preferably, a thin refractory oxide coating is provided which bonds very strongly with epoxies and increases the life expectancy of the package as in U.S. Pat. No. 4,525,422 to Sheldon H. Butt. This oxide can be provided by suitable treatment of certain copper alloys or by coating with a metal or metal alloy which forms such oxides such as nickel as in the previously described embodiments.

If the base member is used for a hermetic package, the sealing material used would most likely be a glass such as the one employed in U.S. Pat. Nos. 4,532,222 and 4,582,556.

There are many other ways to obtain the expanded surface area for the base member. For example, a dendritic coating could be added to the base members' outer surface. There are many configurations of grooves that would be satisfactory to the base members which are not described by either this invention or the drawings but would be applicable to this invention. These other designs are incorporated by reference as part of this invention.

The prior art citations set forth in this application are intended to be incorporated by reference herein.

It is apparent that there has been provided in accordance with this invention a number of embodiments which are especially suited for use in packages of integrated circuits and discrete devices which consume either small amounts or substantial amounts of power which satisfy the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A semiconductor package for housing an electrical component comprising:
   a metal or metal alloy leadframe having first and second opposite surfaces and adapted to have said electrical component connected thereto;
   a copper or copper alloy base member having first and second opposite surfaces with sides there between;
   a copper or copper alloy cap member having first and second opposite surfaces with sides there between;
   said base and cap members having a metal or metal alloy coating selected from the group consisting of: nickel, tin, cobalt, chromium, molybdenum, tungsten, titanium, zirconium, hafnium, niobium, tantalum, germanium, aluminum and alloys of the foregoing metals on at least a first surface of each; and
   a polymer coating bonding said first coated surface of said base member to said first coated surface of said cap member, said leadframe embedded in said polymer component and disposed between said base and cap member.

2. A package as in claim 1 wherein said coating is nickel or a nickel based alloy.

3. The package as in claim 2 wherein the coating provides a roughened surface to said cap member and to said base member for improved bonding.

4. A package as in claim 1 wherein the coating is an electrolytic or electroless plating.

5. A package as in claim 1 wherein the metal or metal alloy leadframe is copper or a copper based alloy.

6. A package as in claim 5 wherein the coating is applied to the sides and both surfaces of said base and cap members.

7. A package as in claim 5 wherein the coating is applied to said first surfaces of said members, to the sides thereof and to the leadframe.

8. A package as in claim 1 wherein said coating is applied to all surfaces of said cap and base members and said leadframe.

9. A package as in claim 1 wherein the polymer component is comprised of:
   a first epoxy sheet between the cap member and the leadframe and a second epoxy sheet between the leadframe and the base member.

10. A package as in claim 9 wherein the package comprises a laminate having the cap member, the first epoxy sheet, the leadframe, the second epoxy sheet and the base member.

11. A package as in claim 1 wherein said package is a dual-in-line package.

12. A package as in claim 1 wherein the package is a quad package with a square shape.

13. A package as in claim 1 wherein the coating has a thickness of between 0.01 and 50 microns.

14. A package as in claim 1 wherein the thickness is in the range of 0.1 to 15 microns.

15. A semiconductor package for an electrical component comprising:
   a metal or metal alloy leadframe having first and second opposite surfaces and being adapted to have said electrical component connected thereto;
   a copper or copper alloy base member having first and second opposite surfaces with sides therebetween;
   a copper or copper alloy cap member, said cap member comprising a frame member and a cover member with said frame member and said cover member each having first and opposite surfaces with sides therebetween, said base and frame members having a metal or metal alloy coating selected from the group consisting of: nickel, tin, cobalt, chromium, molybdenum, tungsten, titanium, zirconium, hafnium, niobium, tantalum, germanium, aluminum, and alloys of the foregoing metals on at least one of said first or second surface;

a polymer component bonding a coated surface of said base member to a coated surface of said frame member, with said leadframe embedded therein and arranged between said base and frame member; and said cap member sealed to said frame member.

16. A package as in claim 15 wherein said coating comprises nickel or a nickel based alloy.

17. The package as in claim 15 wherein the coating provides roughening of the surface of said base and cap members to improve bonding.

18. A package as in claim 15 wherein the coating is an electrolytic or electroless plating.

19. A package as in claim 15 wherein the metal or metal alloy used for the leadframe is a copper or a copper based alloy.

20. A package as in claim 15 wherein the coating is also applied to the sides and each surface of said members.

21. A package as in claim 15 wherein the coating is applied to all surfaces of said members, to the sides thereof and to the leadframe.

22. A package as in claim 15 wherein said coating is applied to all surfaces of said cap and base members and said leadframe.

23. A package as in claim 15 wherein the polymer component is comprised of:

a first sheet between the cap member and the leadframe and a second sheet between the leadframe and the base member.

24. A package as in claim 23 wherein the bonding is comprised of a laminate between the cap member, the first sheet, the leadframe, the second sheet and the base member.

25. A package as in claim 15 wherein said package is a dual-in-line package.

26. A package as in claim 15 wherein the package is a quad package with a square shape.

27. A package as in claim 15 wherein the coating has thickness of between 0.01 to 50 microns.

28. A package as in claim 15 wherein the thickness is in the range of 0.1 to 15 microns.

29. A semiconductor package for an electrical component comprising:

a metal or metal alloy leadframe;

a metal or metal alloy base member having first and second opposite surfaces with sides there between, said first surface including a first cavity adapted to receive said electrical component and said second surface including both a second cavity in opposition to said first cavity and a series of grooves to increase surface area;

a metal or metal alloy cap member having first and second opposite surfaces with sides there-between; and a means for bonding said leadframe to said cap and base members, said leadframe disposed between said cap and base members.

30. A package as in claim 29 wherein said base and cap members have a metal or metal alloy coating selected from the group consisting of nickel, tin, cobalt, chromium, molybdenum, tungsten, titanium, zirconium, hafnium, niobium, tantalum, silicon, germanium, aluminum and alloys of the foregoing metals on at least one of said first or second surface;

and said means for bonding said leadframe to said coated base and cap members comprises a polymer component.

31. A package as in claim 30 wherein said coating provides roughening of the surface of said cap and base members to improve bonding.

32. A package as in claim 30 wherein said coating is applied by electrolytic or electroless plating.

33. A package as in claim 30 wherein said leadframe is coated with a metal or a metal alloy.

34. A package as in claim 29 wherein said cap and base members are copper or a copper alloy.

35. A package as in claim 29 wherein said leadframe is a copper or copper alloy.

36. A package as in claim 29 wherein said leadframe is coated with said metal or a metal alloy.

37. A process for forming a semiconductor package for an electrical component comprising the following steps:

providing a metal or metal alloy leadframe having first and second opposite surfaces and being adapted to have said electrical component connected thereto;

providing a copper or copper alloy base member having first and second opposite surfaces with sides therebetween;

providing a copper or copper alloy cap member having first and second opposite surfaces with sides therebetween;

coating said base and cap members with a metal or metal alloy selected from the group consisting of nickel, tin, cobalt, chromium, molybdenum, tungsten, titanium, zirconium, hafnium, niobium, tantalum, silicon, germanium, aluminum and any alloys of the foregoing metals, on at least one of said first or second surface; and bonding a polymer component to the surface of said base member and to the surface of said cap member with said leadframe being embedded therein between said based end cap member bonded by the polymer.

38. A process as in claim 37 wherein said metal or metal alloy where the leadframe is a copper or copper alloy.

39. A process as in claim 37 wherein said coating provides roughening of the surface of said cap and base members to improve bonding.

40. A process as in claim 37 wherein said metal or metal alloy is plated to said surfaces of said cap and base members.

41. A process as in claim 37 wherein said metal or metal alloy coated to said surfaces receives post-plate treatment.

42. A process as in claim 37 wherein said post-plate treatment is oxidation.

43. A process as in claim 37 wherein said post-plate treatment is passivation.

44. A process as in claim 37 wherein the metal or metal alloy coated to each of said surface are made porous by adjusting the electrical chemical parameters of said metals.

45. A process as in claim 37 wherein the metal or metal alloy to be applied to each of said surface is a nickel, with said nickel coated with a thin layer of aluminum, and having said coated surface being treated to generate Ni-Al intermetallics, and having said coated surface being etched to provide a large surface area.

46. A process as in claim 37 wherein the metal or metal alloy being applied to each of said surface is treated with either silanes or titanates.

47. A process as in claim 37 wherein said metal or metal alloy to be coated to each of said surface are chemically attacked by acids.

* * * * *